United States Patent
Oota et al.

(10) Patent No.: US 8,507,972 B2
(45) Date of Patent: Aug. 13, 2013

(54) NONVOLATILE SEMICONDUCTOR MEMORY DEVICE

(75) Inventors: Shigeto Oota, Kanagawa-ken (JP); Yoshimasa Mikajiri, Kanagawa-ken (JP); Masaru Kito, Kanagawa-ken (JP); Ryouhei Kirisawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 640 days.

(21) Appl. No.: 12/821,551

(22) Filed: Jun. 23, 2010

(65) Prior Publication Data

US 2010/0327340 A1 Dec. 30, 2010

(30) Foreign Application Priority Data

Jun. 25, 2009 (JP) .................................. 2009-150738

(51) Int. Cl.
*H01L 29/94* (2006.01)

(52) U.S. Cl.
USPC .................... 257/324; 257/319; 257/E29.309

(58) Field of Classification Search
USPC ............................ 257/315, 319, 324, E29.309
See application file for complete search history.

(56) References Cited

U.S. PATENT DOCUMENTS

| 8,178,919 B2* | 5/2012 | Fujiwara et al. ............... 257/324 |
| 2011/0309431 A1* | 12/2011 | Kidoh et al. ................... 257/324 |
| 2012/0120728 A1* | 5/2012 | Kim et al. ................. 365/185.18 |
| 2012/0295409 A1* | 11/2012 | Yun et al. ....................... 438/268 |
| 2012/0299086 A1* | 11/2012 | Lee ................................ 257/324 |

FOREIGN PATENT DOCUMENTS

JP 2007-266143 10/2007

* cited by examiner

*Primary Examiner* — Jack Chen
(74) *Attorney, Agent, or Firm* — Oblon, Spivak, McClelland, Maier & Neustadt, L.L.P.

(57) ABSTRACT

According to one embodiment, a nonvolatile semiconductor memory device includes a stacked structural unit, a semiconductor pillar, a memory layer, an inner insulating film, an outer insulating film and a cap insulating film. The unit includes a plurality of electrode films stacked alternately in a first direction with a plurality of inter-electrode insulating films. The pillar pierces the stacked structural unit in the first direction. The memory layer is provided between the electrode films and the semiconductor pillar. The inner insulating film is provided between the memory layer and the semiconductor pillar. The outer insulating film is provided between the memory layer and the electrode films. The cap insulating film is provided between the outer insulating film and the electrode films, and the cap insulating film has a higher relative dielectric constant than the outer insulating film.

20 Claims, 11 Drawing Sheets

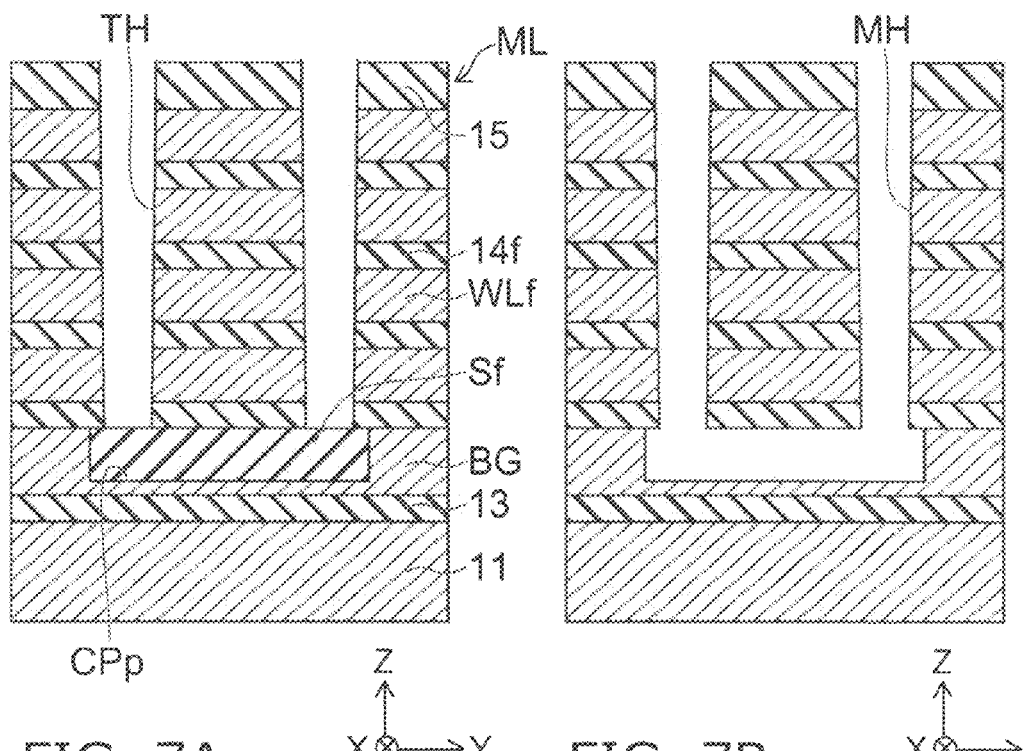
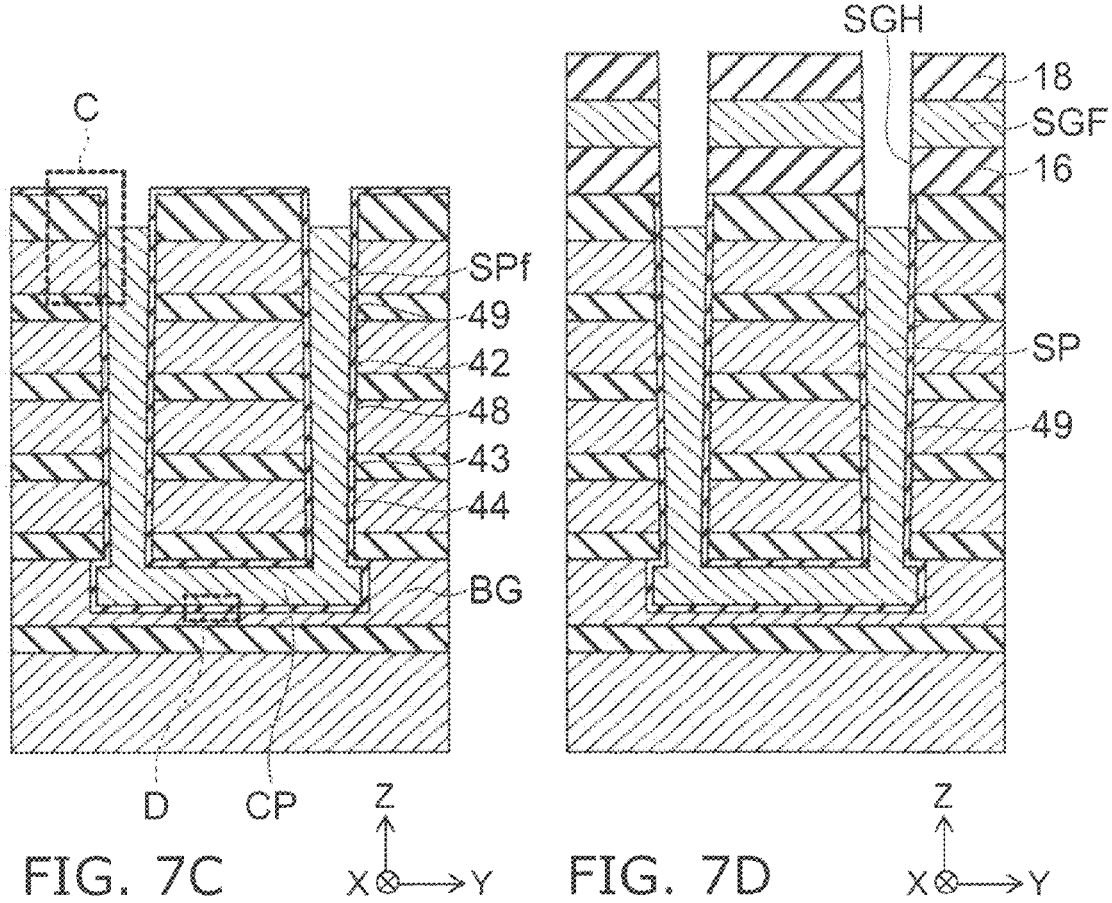

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-150738, filed on Jun. 25, 2009; the entire contents of which are incorporated herein by reference.

FIELD

Embodiments described herein relate generally to a nonvolatile semiconductor memory device.

BACKGROUND

In conventional nonvolatile semiconductor memory devices (memory), elements are integrated in a two-dimensional plane on a silicon substrate. Although the dimensions of one element are reduced (downscaled) to increase the storage capacity of the memory, such downscaling in recent years has become difficult in regard to both cost and technology.

On the other hand, although many ideas for three-dimensional memory, etc., have been proposed, three-dimensional devices generally require processes including at least three lithography processes for each layer. Therefore, costs cannot be reduced even when three-dimensional; and instead, stacking four or more layers undesirably leads to cost increases.

Conversely, collectively patterned three-dimensionally stacked memory cells have been proposed (for example, refer to JP-A 2007-266143 (Kokai)). According to such a method, it is possible to collectively form a stacked memory regardless of the number of stacks. Therefore, it is possible to suppress cost increases.

In such a collectively patterned three-dimensionally stacked memory, a stacked unit is formed on a silicon substrate by alternately stacking insulating films with electrode films forming word lines, and then collectively making through-holes in the stacked unit. Then, for example, a charge storage layer is provided on the side faces of the through-holes; and silicon pillars are provided by filling silicon thereinto. A tunneling insulating film is provided between the charge storage layer and the silicon pillars; and a blocking insulating film is provided between the charge storage layer and the electrode films. Thereby, a memory cell is formed at the intersection between the silicon pillars and each of the electrode films.

Further, two of the through-holes may be connected at the bottoms to form a silicon pillar having a U-shaped configuration. In other words, a memory film including a charge storage layer is formed on the side wall of the through-hole having the U-shaped configuration; and silicon is filled thereinto. Thereby, a memory string made of a silicon pillar having a U-shaped structure can be formed.

In a three-dimensionally stacked memory having such a structure, it is difficult to sufficiently perform erasing operations. Moreover, applying excessive erasing voltage to sufficiently perform the erasing may cause the reliability to deteriorate. For example, because electron injection (back-tunneling) occurs from the blocking oxide film side when the erasing operation is performed, not only is it impossible to bring the memory cell to or below the desired threshold value, but also hot holes created when the electrons reach the channel side are re-injected into the tunneling insulating film; and the reliability of the tunneling insulating film deteriorates.

Thus, there exists a great need to suppress the back-tunneling during the erasing operation of a nonvolatile semiconductor memory device having a collectively patterned three-dimensionally stacked structure to thereby improve the erasing characteristics and increase the reliability.

BRIEF DESCRIPTION OF THE DRAWINGS

FIGS. 7A to 7D are schematic cross-sectional views in order of the processes, illustrating a method for manufacturing the nonvolatile semiconductor memory device according to the embodiment of the invention;

DETAILED DESCRIPTION

Figure 1:
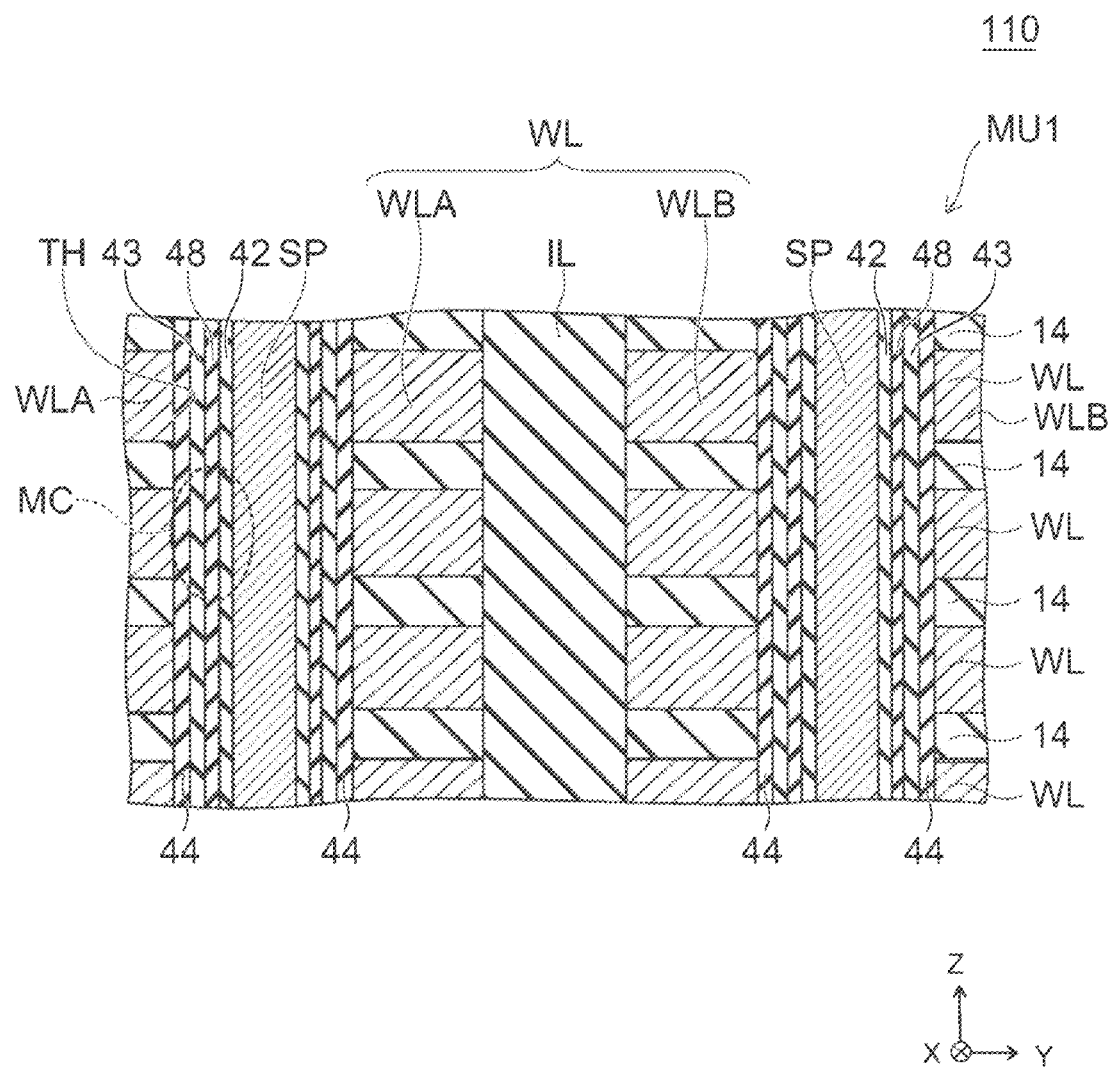
FIG. 1 is a schematic cross-sectional view illustrating the configuration of a nonvolatile semiconductor memory device according to an embodiment of the invention.

In general, according to one embodiment, a nonvolatile semiconductor memory device includes a stacked structural unit, a first semiconductor pillar, a first memory layer, a first inner insulating film, a first outer insulating film and a first cap insulating film. The stacked structural unit includes a plurality of electrode films stacked alternately in a first direction with a plurality of inter-electrode insulating films. The first semiconductor pillar pierces the stacked structural unit in the first direction. The first memory layer is provided between the electrode films and the first semiconductor pillar. The first inner insulating film is provided between the first memory layer and the first semiconductor pillar. The first outer insulating film is provided between the first memory layer and the electrode films. The first cap insulating film is provided between the first outer insulating film and the electrode films, and the first cap insulating film has a relative dielectric constant higher than a relative dielectric constant of the first outer insulating film.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

FIG. 1 is a schematic cross-sectional view illustrating the configuration of a nonvolatile semiconductor memory device according to an embodiment of the invention.

Figure 2:
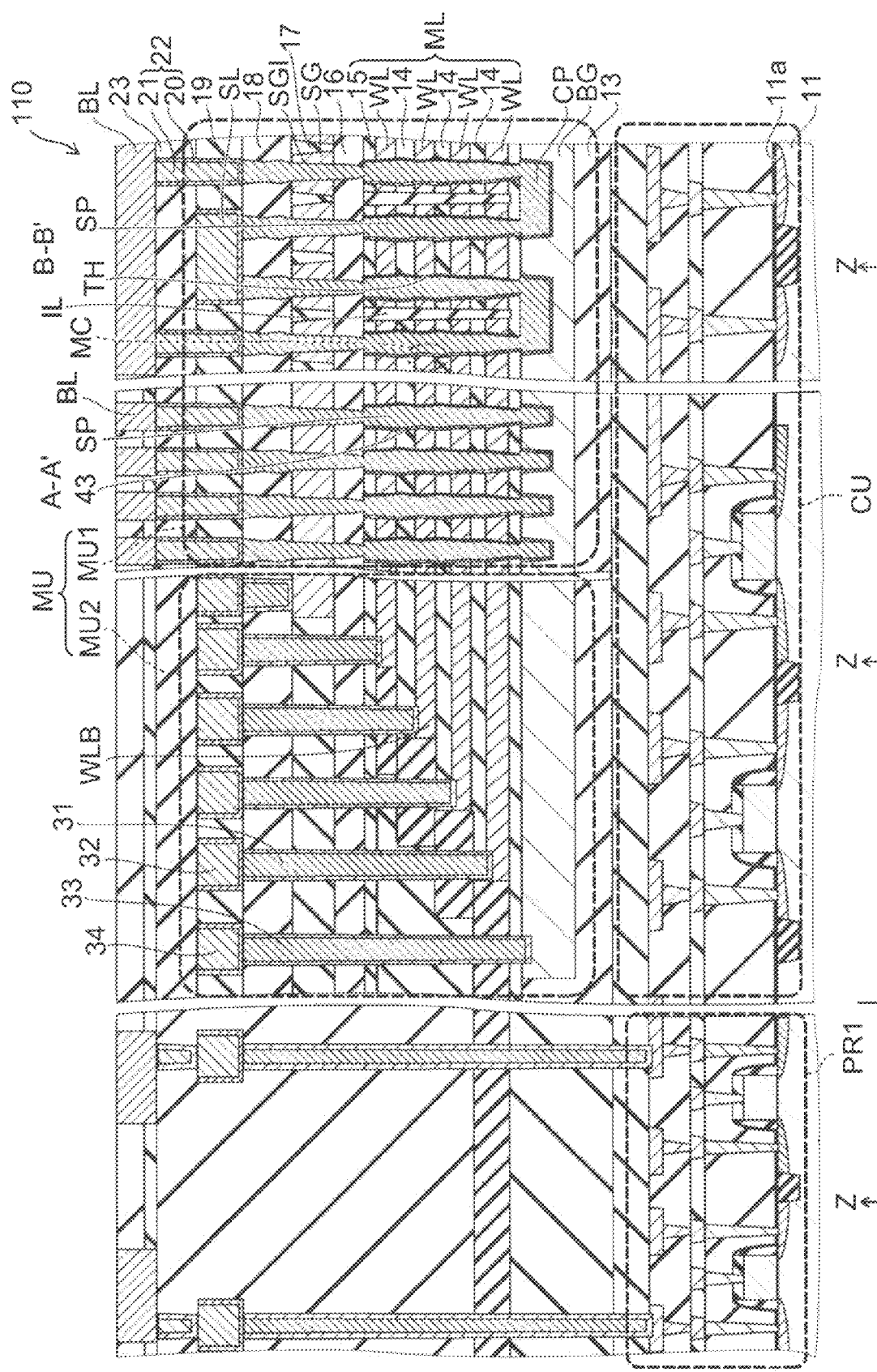
FIG. 2 is a schematic cross-sectional view illustrating the entire configuration of the nonvolatile semiconductor memory device according to the embodiment of the invention.

FIG. 2 is a schematic cross-sectional view illustrating the entire configuration of the nonvolatile semiconductor memory device according to the embodiment of the invention.

Figure 3:
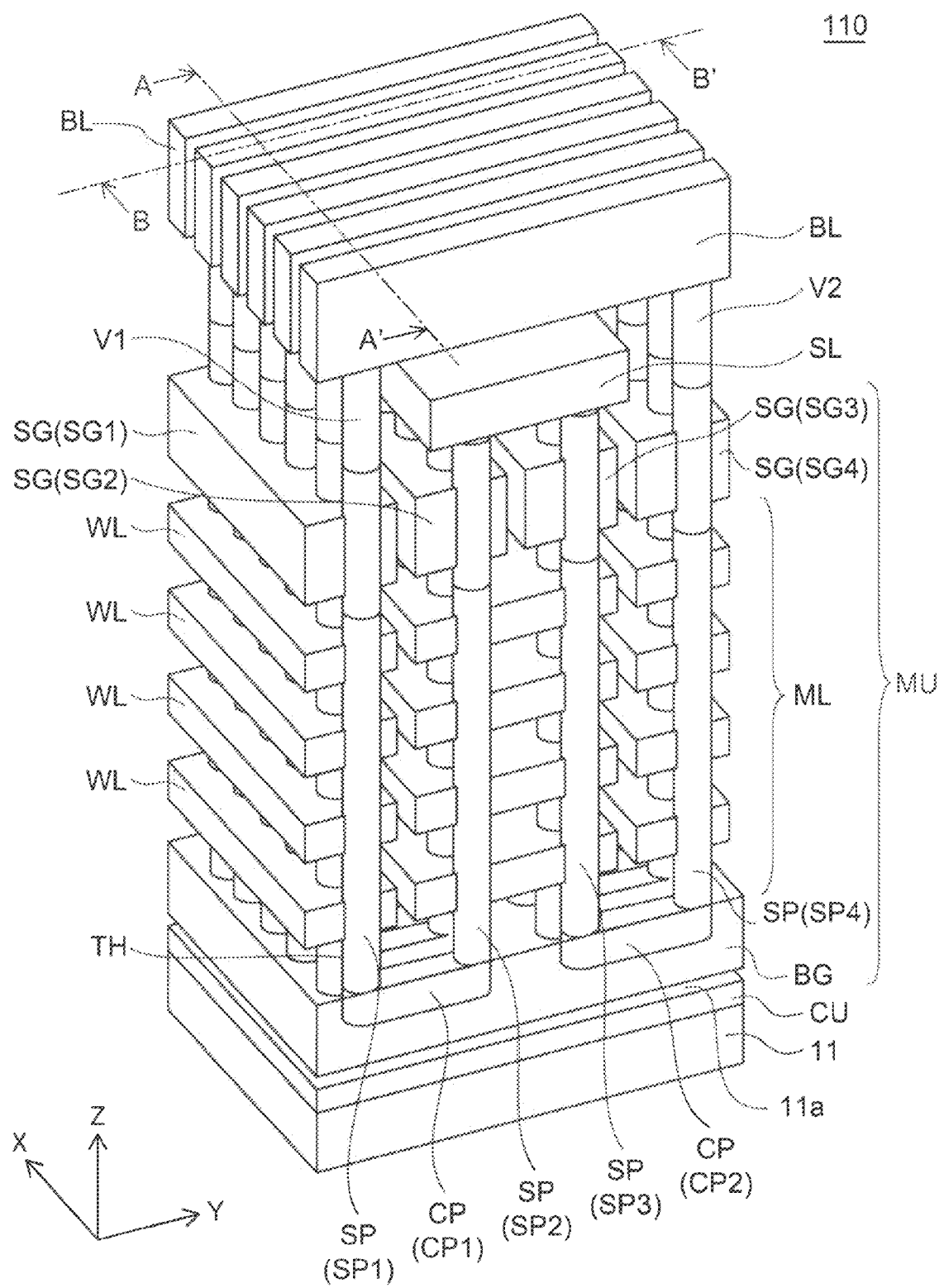
FIG. 3 is a schematic perspective view illustrating the configuration of the nonvolatile semiconductor memory device according to the embodiment of the invention.

FIG. 3 is a schematic perspective view illustrating the configuration of the nonvolatile semiconductor memory device according to the embodiment of the invention.

Figure 4:
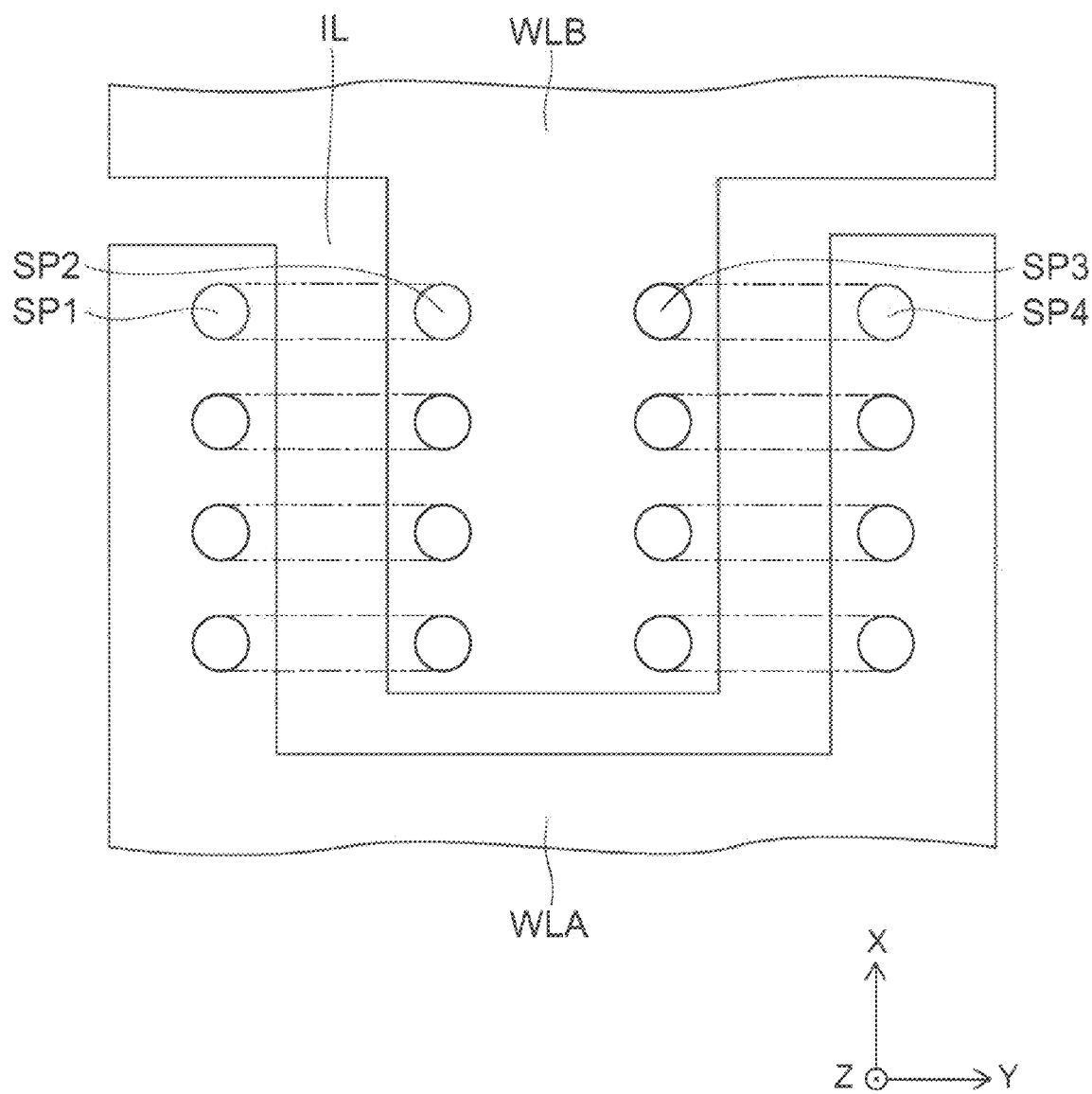
FIG. 4 is a schematic plan view illustrating the configuration of electrode films of the nonvolatile semiconductor memory device according to the embodiment of the invention.

FIG. 4 is a schematic plan view illustrating the configuration of electrode films of the nonvolatile semiconductor memory device according to the embodiment of the invention.

For easier viewing of the drawing in FIG. 3, only the conductive portions are illustrated, and the insulating portions are omitted.

A nonvolatile semiconductor memory device 110 according to the embodiment of the invention is a three-dimensionally stacked flash memory.

First, an overview of the entire configuration of the nonvolatile semiconductor memory device 110 will be described using FIG. 2 and FIG. 3.

As illustrated in FIG. 2, the nonvolatile semiconductor memory device 110 includes a semiconductor substrate 11 made of, for example, monocrystalline silicon.

In this specific example, a memory array region MR and a peripheral region PR are set in the semiconductor substrate 11. Memory cells are formed in the memory array region MR; and the peripheral region PR is provided, for example, peripherally to the memory array region MR. In the peripheral region PR, various peripheral region circuits PR1 are provided on the semiconductor substrate 11.

A circuit unit CU, for example, is provided on the semiconductor substrate 11 in the memory array region MR. A memory unit MU is provided on the circuit unit CU. The circuit unit CU may be provided as necessary, and may be omitted. An inter-layer insulating film 13 made of, for example, silicon oxide is provided between the circuit unit CU and the memory unit MU.

The memory unit MU includes a matrix memory cell unit MU1 and an interconnect connection unit MU2. The matrix memory cell unit MU1 includes memory cell transistors arranged in a three-dimensional matrix configuration. The interconnect connection unit MU2 connects the interconnections of the matrix memory cell unit MU1.

FIG. 3 illustrates the configuration of the matrix memory cell unit MU1.

Namely, FIG. 2 illustrates a portion of the cross section along line A-A' of FIG. 3 and a portion of the cross section along line B-B' of FIG. 3 as the matrix memory cell unit MU1.

As illustrated in FIG. 2 and FIG. 3, a stacked structural unit ML is provided on a major surface 11a of the semiconductor substrate 11 in the matrix memory cell unit MU1. The stacked structural unit ML includes multiple electrode films WL alternately stacked with multiple inter-electrode insulating films 14 in a direction perpendicular to the major surface 11a.

An XYZ orthogonal coordinate system will now be introduced for convenience of description in the specification of the application. In this coordinate system, a direction perpendicular to the major surface 11a of the semiconductor substrate 11 is taken as a Z axis direction (the first direction). One direction in a plane parallel to the major surface 11a is taken as a Y axis direction (the second direction). A direction perpendicular to the Z axis and the Y axis is taken as an X axis direction (the third direction).

The stacking direction of the electrode films WL and the inter-electrode insulating films 14 in the stacked structural unit ML is the Z axis direction.

A semiconductor pillar SP (a first semiconductor pillar SP1) is provided to pierce the stacked structural unit ML in the Z axis direction. The semiconductor pillar SP is formed by filling a semiconductor into a through-hole TH piercing the stacked structural unit ML in the Z axis direction.

FIG. 1 illustrates the configuration of the matrix memory cell unit MU1 corresponding to, for example, a portion of the cross section along line B-B' of FIG. 3.

As illustrated in FIG. 1, the nonvolatile semiconductor memory device 110 includes the stacked structural unit ML including the multiple electrode films WL stacked alternately in the Z axis direction with the multiple inter-electrode insulating films 14, the semiconductor pillar SP (the first semiconductor pillar SP1) piercing the stacked structural unit ML in the Z axis direction, a memory layer 48 (the first memory layer) provided between the semiconductor pillar SP and each of the electrode films WL, an inner insulating film 42 (the first inner insulating film), an outer insulating film 43 (the first outer insulating film), and a cap insulating film 44 (the first cap insulating film).

The inner insulating film 42 is provided between the memory layer 48 and the semiconductor pillar SP and functions as a tunneling insulating film.

The outer insulating film 43 is provided between the memory layer 48 and the electrode film WL and functions as a blocking insulating film.

The cap insulating film 44 is provided between the outer insulating film 43 and the electrode film WL. The relative dielectric constant of the cap insulating film 44 is higher than that of the outer insulating film 43.

Although the outer insulating film 43 functions as the blocking insulating film, the blocking insulating film may be considered to be a combined insulating film of the outer insulating film 43 and the cap insulating film 44.

The inter-electrode insulating film 14 functions as an inter-layer insulating film that insulates the electrode films WL from each other.

The electrode film WL may include any conductive material. For example, amorphous silicon, polysilicon, and the like having an impurity introduced to provide electrical conductivity may be used; and metals, alloys, etc., also may be used. A prescribed electrical signal is applied to the electrode film WL; and the electrode film WL functions as a word line of the nonvolatile semiconductor memory device 110.

The inter-electrode insulating film 14, the inner insulating film 42, and the outer insulating film 43 may include, for example, a silicon oxide film (silicon oxide). The cap insulating film 44 may include, for example, a silicon nitride film (silicon nitride), i.e., an insulating film having a relative dielectric constant higher than that of the outer insulating film 43.

The memory layer 48 may include, for example, a silicon nitride film and functions as a portion that stores information by storing or emitting charge due to an electric field applied between the semiconductor pillar SP and the electrode films WL. The memory layer 48 may be a single-layer film or a stacked film.

As described below, the inter-electrode insulating film 14, the inner insulating film 42, the outer insulating film 43, and the memory layer 48 are not limited to the materials recited above; and any material that satisfies the condition of having a relative dielectric constant higher than that of the outer insulating film 43 may be used as the cap insulating film 44.

Thus, in the nonvolatile semiconductor memory device 110, cell transistors including the memory layer 48 are formed at portions where the electrode films WL intersect the semiconductor pillars SP. The cell transistors are arranged in a three-dimensional matrix configuration. The cell transistors function as memory cells MC to store data by storing charge in the memory layer 48.

Although four of the electrode films WL are illustrated in FIG. 2 and FIG. 3, any number of the electrode films WL may be provided in the stacked structural unit ML.

As illustrated in FIG. 2 and FIG. 3, a selection gate electrode SG is provided on the stacked structural unit ML. The selection gate electrode SG may include any conductive material. For example, polysilicon, amorphous silicon, and the like may be used. The selection gate electrode SG has, for example, a band configuration aligned along the X axis direction.

As illustrated in FIG. 2, an inter-layer insulating film 15 is provided in the uppermost portion (the side most distal to the semiconductor substrate 11) of the stacked structural unit ML. An inter-layer insulating film 16 is provided on the stacked structural unit ML; the selection gate electrodes SG are provided thereupon; and an inter-layer insulating film 17 is provided between the selection gate electrodes SG. A through-hole is provided in the selection gate electrode SG; a selection gate insulating film SGI of the selection gate transistor is provided on the inner side face thereof; and a semiconductor is filled thereinto. The semiconductor communicates with the semiconductor pillar SP.

An inter-layer insulating film 18 is provided on the inter-layer insulating film 17; and a source line SL (the second interconnection) and a via 22 are provided thereupon. An inter-layer insulating film 19 is provided around the source line SL. The via 22 includes a stacked film of, for example, a barrier layer 20 and a metal layer 21.

An inter-layer insulating film 23 is provided on the source line SL; and a bit line BL (the first interconnection) is provided thereupon. The bit line BL has, for example, a band configuration along the Y axis. The inter-layer insulating films 15, 16, 17, 18, 19, and 23 and the selection gate insulating film SGI may include, for example, silicon oxide.

Thus, multiple through-holes TH are made in the stacked structural unit ML and the selection gate electrode SG to align in the stacking direction (the Z axis direction). An insulating film is provided on the side faces of the interiors thereof. A semiconductor material is filled into the space on the inner side thereof to form the semiconductor pillars SP. In other words, the semiconductor pillar SP provided in the stacked structural unit ML also pierces the selection gate electrode SG at the upper portion of the stacked structural unit ML.

In this specific example, every two semiconductor pillars SP are connected on the semiconductor substrate 11 side.

In other words, the nonvolatile semiconductor memory device 110 further includes a semiconductor connection portion CP (a first semiconductor connection portion CP1) that electrically connects the first semiconductor pillar SP1 to a second semiconductor pillar SP2 on the semiconductor substrate 11 side. The semiconductor connection portion CP is made of a material forming the semiconductor pillars SP. The semiconductor connection portion CP opposes a back gate BG (the connection portion conductive layer).

However, the invention is not limited thereto. As described below, each of the semiconductor pillars SP may be independent and need not be connected by the semiconductor connection portion CP on the semiconductor substrate 11 side. The case will now be described where two of the semiconductor pillars SP are connected by the semiconductor connection portion CP as illustrated in FIG. 2 and FIG. 3.

Herein, the semiconductor pillar is multiply provided in the nonvolatile semiconductor memory device 110. "Semiconductor pillar SP" is used to refer to all of the semiconductor pillars or any semiconductor pillar; and "nth semiconductor pillar SPn" (n being any integer not less than 1) is used to refer to a designated semiconductor pillar when describing the relationship among designated semiconductor pillars, etc. This similarly applies to the other components. For example, "semiconductor connection portion CP" is used to refer to all of the semiconductor connection portions or any semiconductor connection portion; and "nth semiconductor connection portion CPn" (n being any integer not less than 1) is used to refer to a designated semiconductor connection portion.

As illustrated in FIG. 3, the first and second semiconductor pillars SP1 and SP2 are connected as a pair by the first semiconductor connection portion CP1 to form one NAND string having a U-shaped configuration. The third and fourth semiconductor pillars SP3 and SP4 are connected as a pair by a second semiconductor connection portion CP2 to form another NAND string having a U-shaped configuration.

As illustrated in FIG. 4, for the electrode films WL, the electrode films corresponding to the semiconductor pillars SP (4 m+1) and SP (4 m+4) are commonly connected to form an electrode film WLA, where m is an integer not less than 0 and n recited above is (4 m+1) and (4 m+4); and the electrode films corresponding to the semiconductor pillars SP(4 m+2) and SP(4 m+3) are commonly connected to form an electrode film WLB, where n is (4 m+2) and (4 m+3). In other words, the electrode films WL have a configuration in which the electrode film WLA and the electrode film WLB are combined with each other in a comb teeth configuration opposing in the X-axis direction. As illustrated in FIG. 1, the electrode film WLA and the electrode film WLB are divided from each other by an insulating layer IL.

As in the interconnect connection unit MU2 illustrated in FIG. 2, the electrode film WLB is connected at one end in the X axis direction to a word line 32 by a via plug 31 and is electrically connected to, for example, a drive circuit provided on the semiconductor substrate 11. Similarly, the electrode film WLA is connected at the other end in the X axis direction to the word line by the via plug and is electrically connected to the drive circuit. In other words, the length in the X axis direction of each of the electrode films WL (the electrode films WLA and the electrode films WLB) stacked in the Z axis direction changes in a stairstep configuration; and the electrode films WL are electrically connected to the drive circuit by the electrode films WLA at the one end in the X axis direction and by the electrode films WLB at the other end in the X axis direction.

Thereby, for the electrode films WL at the same distance from the semiconductor substrate 11, different potentials can be set for the pair of the first semiconductor pillar SP1 and the second semiconductor pillar SP2. Thereby, the memory cells of the same layer corresponding to the first semiconductor pillar SP1 and the second semiconductor pillar SP2 can be operated independently from each other. This is similar for the third semiconductor pillar SP3 and the fourth semiconductor pillar SP4.

The combination of the electrode film WLA and the electrode film WLB can be taken to be one erasing block; and the electrode film WLA and the electrode film WLB can be divided from other electrode films WLA and electrode films WLB for each erasing block.

The number of the semiconductor pillars included in each of the erasing blocks in the X axis direction and the Y axis direction is arbitrary.

The back gate BG is connected to a back gate interconnection 34 by a via plug 33.

As illustrated in FIG. 2 and FIG. 3, each of the ends of the semiconductor pillars SP opposite to the semiconductor connection portion CP is connected to the bit line BL or the source line SL; and the selection gate electrode SG (the first to fourth selection gate electrodes SG1 to SG4) is provided on each of the semiconductor pillars SP. Thereby, the desired data can be written to or read from any of the memory cells MC of any of the semiconductor pillars SP.

In other words, the nonvolatile semiconductor memory device 110 further includes the second semiconductor pillar SP2, a stacked film provided relating to the second semiconductor pillar SP2, the first semiconductor connection portion CP1, the bit line BL, and the source line SL.

The second semiconductor pillar SP2 pierces the stacked structural unit ML in the Z axis direction and is adjacent to the first semiconductor pillar SP1 in the Y axis direction.

The stacked film provided relating to the second semiconductor pillar SP2 includes the second memory layer (the memory layer 48) provided between the electrode film WL and the second semiconductor pillar SP2, the second inner insulating film (the inner insulating film 42) provided between the second memory layer and the second semiconductor pillar SP2, the second outer insulating film (the outer insulating film 43) provided between the second memory layer and the electrode film WL, and the second cap insulating film (the cap insulating film 44) provided between the second outer insulating film and the electrode film WL, where the second cap insulating film has a relative dielectric constant higher than that of the second outer insulating film.

The first semiconductor connection portion CP1 electrically connects the first semiconductor pillar SP1 and the second semiconductor pillar SP2 on the same side (the semiconductor substrate 11 side) in the Z axis direction. The bit line BL is aligned in the Y axis direction and is connected to a first end portion of the first semiconductor pillar SP1 on the side opposite to the first semiconductor connection portion CP1. The source line SL is aligned in the X axis direction and is connected to a second end portion of the second semiconductor pillar SP2 on the side opposite to the first semiconductor connection portion CP1.

The nonvolatile semiconductor memory device 110 may further include the third semiconductor pillar SP3, a stacked film provided relating to the third semiconductor pillar SP3, the fourth semiconductor pillar SP4, a stacked film provided relating to the fourth semiconductor pillar SP4, and the second semiconductor connection portion CP2.

The third semiconductor pillar SP3 is adjacent to the second semiconductor pillar SP2 in the Y axis direction on the side of the second semiconductor pillar SP2 opposite to the first semiconductor pillar SP1 and pierces the stacked structural unit ML in the Z axis direction.

The stacked film provided relating to the third semiconductor pillar SP3 includes the third memory layer (the memory layer 48) provided between the electrode film WL and the third semiconductor pillar SP3, the third inner insulating film (the inner insulating film 42) provided between the third memory layer and the third semiconductor pillar SP3, the third outer insulating film (the outer insulating film 43) provided between the third memory layer and the electrode film WL, and the third cap insulating film (the cap insulating film 44) provided between the third outer insulating film and the electrode film WL, where the third cap insulating film has a relative dielectric constant higher than that of the third outer insulating film.

The fourth semiconductor pillar SP4 is adjacent to the third semiconductor pillar SP3 in the Y axis direction on the side of the third semiconductor pillar SP3 opposite to the second semiconductor pillar SP2 and pierces the stacked structural unit ML in the Z axis direction.

The stacked film provided relating to the fourth semiconductor pillar SP4 includes the fourth memory layer (the memory layer 48) provided between the electrode film WL and the fourth semiconductor pillar SP4, the fourth inner insulating film (the inner insulating film 42) provided between the fourth memory layer and the fourth semiconductor pillar SP4, the fourth outer insulating film (the outer insulating film 43) provided between the fourth memory layer and the electrode film WL, and the fourth cap insulating film (the cap insulating film 44) provided between the fourth outer insulating film and the electrode film WL, where the fourth cap insulating film has a relative dielectric constant higher than that of the fourth outer insulating film.

The second semiconductor connection portion CP2 electrically connects the third semiconductor pillar SP3 and the fourth semiconductor pillar SP4 on the first semiconductor connection portion CP1 side (the semiconductor substrate 11 side) in the Z axis direction.

The bit line BL is connected to a fourth end portion of the fourth semiconductor pillar SP4 on the side opposite to the second semiconductor connection portion CP2. The source line SL is connected to a third end portion of the third semiconductor pillar SP3 on the side opposite to the second semiconductor connection portion CP2.

By using the high relative dielectric constant cap insulating film 44 in the nonvolatile semiconductor memory device 110 having such a structure, back-tunneling during the erasing operation can be suppressed. Thereby, the erasing characteristics can be improved and the high reliability can be achieved. Characteristics of the nonvolatile semiconductor memory device 110 will now be described.

Figure 5:
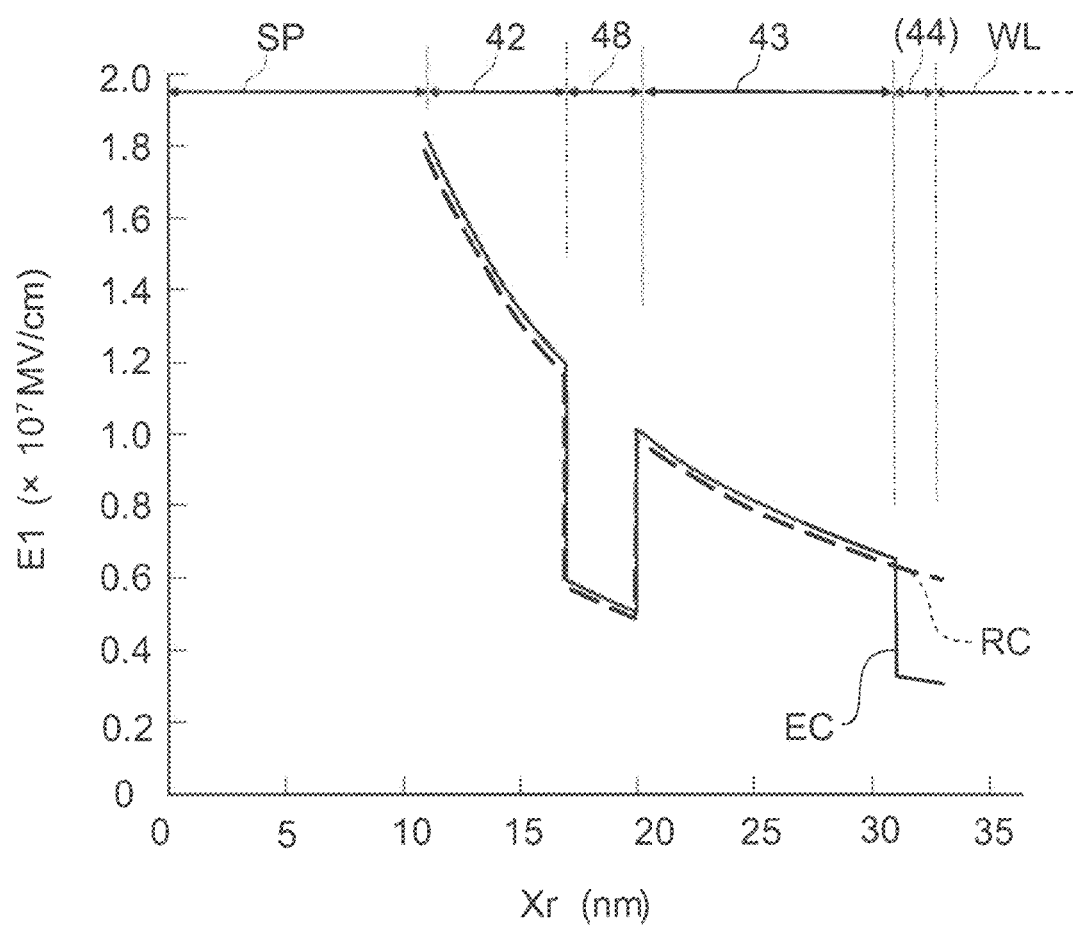
FIG. 5 is a graph illustrating characteristics of the nonvolatile semiconductor memory device according to the embodiment of the invention.

FIG. 5 is a graph illustrating characteristics of the nonvolatile semiconductor memory device according to the embodiment of the invention.

Namely, FIG. 5 illustrates simulation results of an electric field E1 applied to the semiconductor pillar SP, the inner insulating film 42, the memory layer 48, the outer insulating film 43, and the cap insulating film 44 of the nonvolatile semiconductor memory device 110. A position Xr (e.g., a position in the X axis direction) is plotted on the horizontal axis. The electric field E1 is plotted on the vertical axis.

FIG. 5 illustrates the simulation results when the distance from the center of the semiconductor pillar SP to the electrode film WL in the X-Y plane (corresponding to the radius of the through-hole TH) is 33 nm (nanometers) and a voltage of 20 V (volts) is applied between the semiconductor pillar SP and the electrode film WL. The range in which the position Xr is 0 nm to 11 nm corresponds to the semiconductor pillar SP; the range in which the position Xr is 11 nm to 17 nm corresponds to the inner insulating film 42; the range in which the position Xr is 17 nm to 20 nm corresponds to the memory layer 48; the range in which the position Xr is 20 nm to 31 nm corresponds to the outer insulating film 43; the range in which the position Xr is 31 nm to 33 nm corresponds to the cap insulating film 44; and the region in which the position Xr is greater than 33 nm corresponds to the electrode film WL. In other words, the diameter of the semiconductor pillar SP is 22 nm; the thickness of the inner insulating film 42 is 6 nm; the thickness of the memory layer 48 is 3 nm; the thickness of the outer insulating film 43 is 11 nm; and the thickness of the cap insulating film 44 is 2 nm. The case is illustrated where a silicon oxide film (having a relative dielectric constant of about 4) is used as the inner insulating film 42 and the outer insulating film 43 and a silicon nitride film (having a relative dielectric constant of about 7) is used as the memory layer 48 and the cap insulating film 44.

In FIG. 5, a characteristic RC (the broken line) illustrates the case where, as a comparative example, the cap insulating film 44 is not used and the outer insulating film 43 has a thickness of 13 nm. On the other hand, the characteristic of this embodiment is illustrated by a characteristic EC (the solid line).

For the characteristic RC of the comparative example in which the cap insulating film 44 is not used as illustrated in FIG. 5, the electric field E1 is high, i.e., about $0.6 \times 10^7$ MV/cm, at the position where the electrode film WL contacts the outer insulating film 43 (where the position Xr is 33 nm). Therefore, electrons are easily injected from the electrode film WL into the outer insulating film 43. In other words, back-tunneling occurs easily.

Conversely, for the characteristic EC of the nonvolatile semiconductor memory device 110 according to the embodiment including the cap insulating film 44, the electric field E1 is low, i.e., about $0.3 \times 10^7$ MV/cm at the position where the electrode film WL contacts the cap insulating film 44 (where the position Xr is 33 nm), which is half of that of the comparative example. Therefore, electrons are not easily injected from the electrode film WL into the cap insulating film 44 and the outer insulating film 43; and back-tunneling does not occur easily.

Figure 6A:
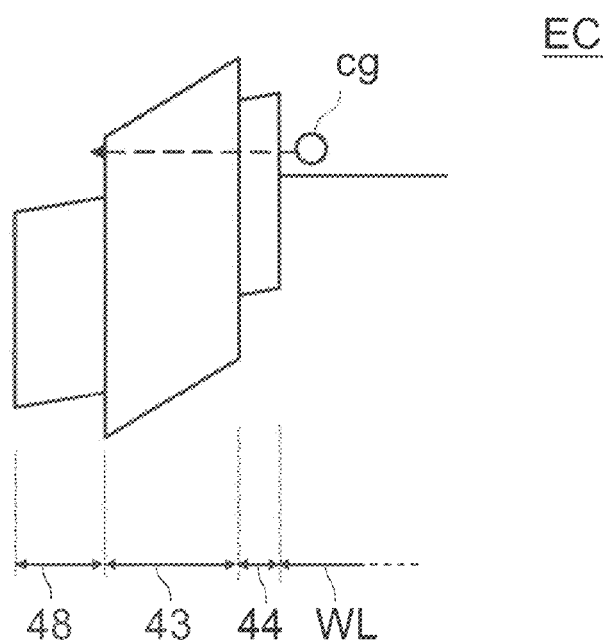
FIGS. 6A and 6B are schematic views illustrating the characteristics of the nonvolatile semiconductor memory devices of the embodiment of the invention and the comparative example.
Figure 6B:
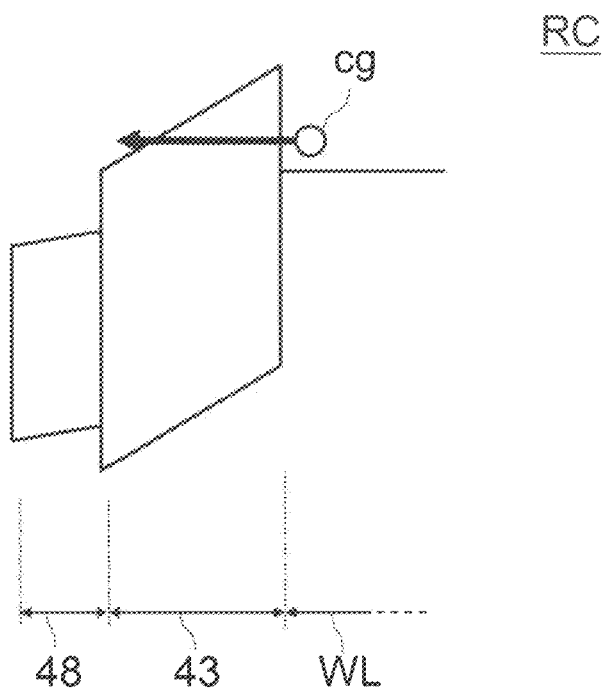

FIGS. 6A and 6B are schematic views illustrating the characteristics of the nonvolatile semiconductor memory devices of the embodiment of the invention and the comparative example.

Namely, FIGS. 6A and 6B are energy band diagrams providing model-like illustrations of the characteristics of the nonvolatile semiconductor memory device 110 according to the embodiment and the nonvolatile semiconductor memory device of the comparative example, respectively.

In the case of the nonvolatile semiconductor memory device of the comparative example in which the cap insulating film 44 is not used as illustrated in FIG. 6B, the electric field E1 is high at the interface between the electrode film WL and the blocking insulating film (the outer insulating film 43). Therefore, the energy difference at the interface between the electrode film WL and the blocking insulating film is reduced; and a charge cg (electrons) is injected easily from the electrode film WL into the blocking insulating film.

On the other hand, in the case of the nonvolatile semiconductor memory device 110 including the cap insulating film 44 as illustrated in FIG. 6A, the electric field E1 at the interface between the electrode film WL and the cap insulating film 44 is low. Therefore, the energy difference at the interface between the electrode film WL and the cap insulating film 44 is large; and the charge cg (the electrons) is not injected easily from the electrode film WL toward the cap insulating film 44.

Thus, by using the high relative dielectric constant cap insulating film 44 in the nonvolatile semiconductor memory device 110 according to this embodiment, back-tunneling can be suppressed.

In the nonvolatile semiconductor memory device 110 having a collectively patterned three-dimensionally stacked structure, the outer insulating film 43 (the blocking insulating film) is provided on the outer side of the memory layer 48 having a pipe-like configuration; and the inner insulating film 42 (the tunneling insulating film) is provided on the inner side. Therefore, even in the case where materials having the same relative dielectric constant are used as the outer insulating film 43 and the inner insulating film 42, a difference in the electric fields applied to the outer insulating film 43 and the inner insulating film 42 occurs due to the difference of the curvature radii of the outer and inner sides of the cylinder. Therefore, good characteristics can be obtained without using a new material such as a high dielectric constant material as the outer insulating film 43. In other words, the outer insulating film 43 (and the inner insulating film 42) may include, for example, a silicon oxide film which is widely used in conventional semiconductor devices, has high reliability, and has high compatibility of process integration.

Conversely, when a tunneling current flows during writing/erasing operations in the case of a planar memory, the electric field applied to the blocking insulating layer has substantially the same intensity as that applied to the tunneling insulating film in the case where materials having the same relative dielectric constant are used as the blocking insulating layer and the tunneling insulating film. Therefore, current undesirably flows in the blocking insulating layer. Therefore, problems occur, particularly when the erasing bias is applied, in which the threshold value cannot be reduced due to the reverse injection of electrons from the gate electrode. It may be considered possible to solve such problems and provide the desired writing/erasing operations by using a material as the blocking insulating layer having a relative dielectric constant higher than that of the tunneling insulating film; providing a difference between the electric field applied to the tunneling insulating film and the electric field applied to the blocking insulating layer; and reducing the leak current of the blocking insulating layer. However, using a material having a high relative dielectric constant reduces the compatibility of process integration and may result in unstable operations from changes in the dielectric constant over time due to a delay of the dielectric polarization unique to materials having high relative dielectric constants.

Conversely, in the nonvolatile semiconductor memory device 110 according to this embodiment as described above, the inner insulating film 42 and the outer insulating film 43 are provided on the inner and outer side faces of the memory layer having a pipe-like configuration; and an electric field difference can be caused due to the curvature difference. Therefore, constraints on the relative dielectric constant required for the outer insulating film 43 can be relaxed; the compatibility of process integration can be high, for example, for both the inner insulating film 42 and the outer insulating film 43; and a silicon oxide film having high reliability can be used.

In the case where, for example, a silicon oxide film having a low relative dielectric constant is used as the outer insulating film 43, back-tunneling during the erasing operation is suppressed by the effects described in regard to FIG. 5 and FIG. 6 by providing the high relative dielectric constant cap insulating film 44 between the outer insulating film 43 and the electrode film WL. Thereby, the erasing characteristics can be improved and the high reliability can be achieved.

In other words, in the nonvolatile semiconductor memory device 110, the erasing characteristics are good, the reliability is high, and the compatibility of process integration is high by using, in particular, a silicon oxide film as the outer insulating film 43 while using the cap insulating film 44 having a relative dielectric constant higher than that of the silicon oxide film; and a highly reliable nonvolatile semiconductor memory device can be provided.

Thus, it is desirable for the outer insulating film 43 to include silicon oxide and the cap insulating film 44 to include silicon nitride. It is desirable also for the outer insulating film 43 to include silicon oxide and the cap insulating film 44 to include aluminum oxide.

In the nonvolatile semiconductor memory device 110, it is desirable for the thickness of the cap insulating film 44 to be thinner than that of the outer insulating film 43.

In the case where, for example, silicon nitride films are used in both the cap insulating film 44 and the memory layer 48 and the thickness of the cap insulating film 44 is relatively thick, there is a possibility that a phenomenon in which charge is retained in the cap insulating film 44 may occur simultaneously with the phenomenon in which charge is retained in the memory layer 48. By making the thickness of the cap insulating film 44 relatively thin in such a case, the charge in the cap insulating film 44 moves in either the direction of the electrode film WL or the direction of the outer insulating film 43 and is not easily retained in the cap insulating film 44.

For example, the thickness of the outer insulating film 43 may be set to, for example, about 5 nm to 20 nm. The thickness of the cap insulating film 44 may be set to, for example, about 1 nm to 4 nm. However, the values recited above are examples; and the invention is not limited thereto. The thicknesses of the outer insulating film 43 and the cap insulating film 44 may be set appropriately based on the materials of these films, the diameter of the through-hole TH, the operating conditions of the nonvolatile semiconductor memory device, etc.

Although the case is described above where the outer insulating film 43 is a single-layer film, the outer insulating film 43 may be a stacked film made of multiple layers. In such a case, the average relative dielectric constant of the multiple layers may be taken as the relative dielectric constant of the outer insulating film 43; and it is sufficient for the relative dielectric constant of the cap insulating film 44 to be higher than this relative dielectric constant. The average relative dielectric constant recited above may be taken as, for example, an effective relative dielectric constant determined from the voltage applied to the entire stacked film and the charge stored at that time in the case where the stacked film is taken as an electrical capacitance of multiple layers connected in series.

For example, the outer insulating film 43 may be a stacked film having two silicon oxide films and a silicon nitride film stacked therebetween. In such a case, a silicon nitride film (or a silicon oxynitride film) having a dielectric constant higher than the average relative dielectric constant of the stacked films may be used as the cap insulating film 44.

Although the case is described above where the outer insulating film 43 and the cap insulating film 44 are separate entities, the invention is not limited thereto.

In other words, the boundary between the outer insulating film 43 and the cap insulating film 44 may not be distinctly discriminable; and the relative dielectric constant of the portion of the insulating film provided between the memory layer 48 and the electrode film WL may be relatively higher on the electrode film WL side (the outer side) than that of the portion on the memory layer 48 side (the inner side). For example, the proportion of elements included in the insulating film provided between the memory layer 48 and the electrode film WL may change relatively from the portion of the insulating film on the memory layer 48 side toward the portion on the electrode film WL side; and as a result, the relative dielectric constant on the electrode film WL side may be relatively high.

In other words, the nonvolatile semiconductor memory device 110 may further include an intermediate layer provided, for example, between the outer insulating film 43 and the cap insulating film 44 and having a relative dielectric constant higher than that of the outer insulating film 43 and lower than that of the cap insulating film 44. In such a case, the relative dielectric constant of the outer insulating film 43, the relative dielectric constant of the intermediate layer, and the relative dielectric constant of the cap insulating film 44 may change in discontinuous steps or may change continuously. For example, the relative dielectric constant of the intermediate layer may changes continuously along a direction from the outer insulating film 43 to the cap insulating film 44.

An example of a method for manufacturing the nonvolatile semiconductor memory device 110 will now be described.

FIGS. 7A to 7D are schematic cross-sectional views in order of the processes, illustrating the method for manufacturing the nonvolatile semiconductor memory device according to the embodiment of the invention.

Figure 8A:
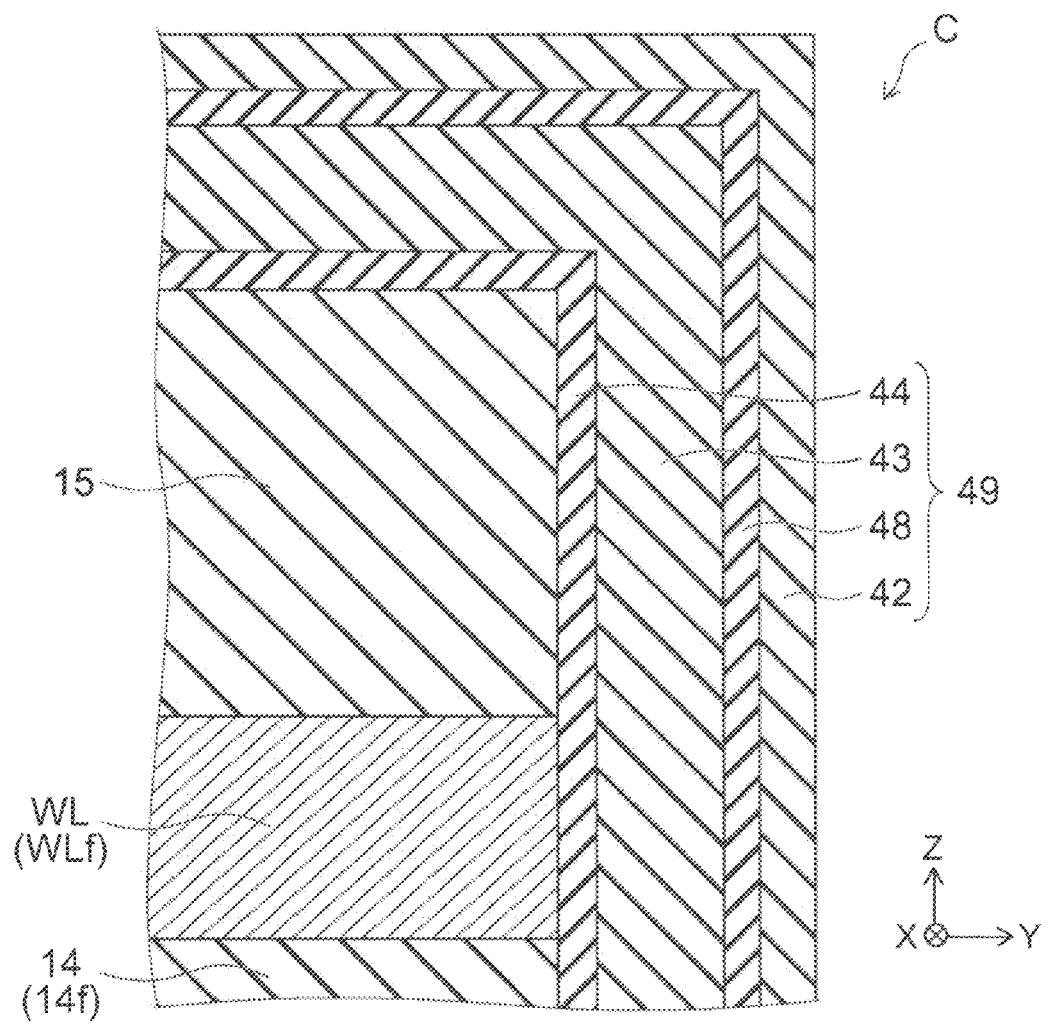
FIGS. 8A and 8B are schematic cross-sectional views illustrating structures of main components of one process of the method for manufacturing the nonvolatile semiconductor memory device according to the embodiment of the invention.
Figure 8B:
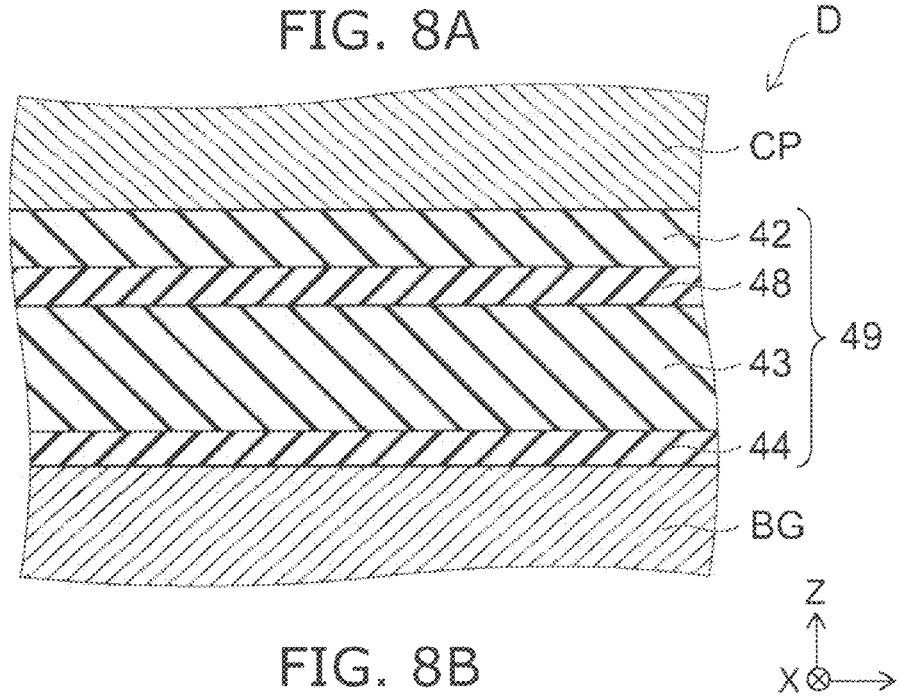

FIGS. 8A and 8B are schematic cross-sectional views illustrating structures of main components of one process of the method for manufacturing the nonvolatile semiconductor memory device according to the embodiment of the invention.

Namely, FIGS. 8A and 8B are schematic cross-sectional views of a portion C and a portion D of FIG. 7C.

As illustrated in FIG. 7A, a silicon oxide film forming the inter-layer insulating film 13 is deposited with, for example, a thickness of 100 nm on the semiconductor substrate 11 made of silicon; and a conductive film BGf forming the back gate BG of, for example, 200 nm is further deposited. The conductive film BGf may include, for example, As-doped amorphous silicon, P-doped amorphous silicon, and the like. Subsequently, a trench pattern CPp in which the semiconductor connection portion CP is formed is made in the conductive film BGf using lithography and RIE (Reactive Ion Etching); and a sacrificial layer Sf made of a silicon nitride film is filled into the trench pattern CPp.

Subsequently, an insulating film 14f forming the inter-electrode insulating film 14 and a conductive film WLf forming the electrode film WL are deposited alternately with the desired number of repetitions on the conductive film BGf and the sacrificial layer Sf; and the inter-layer insulating film 15 is deposited thereupon. The conductive film WLf may include, for example, As-doped amorphous silicon, P-doped amorphous silicon, and the like. Thereby, the stacked structural unit ML is formed. Herein, it is taken that the inter-layer insulating film 15 is included in the stacked structural unit ML. Subsequently, the through-holes TH are made by collective patterning in the stacked structural unit ML by photolithography and RIE. In such a case, the through-hole TH is made to a depth reaching the sacrificial layer Sf filled into the trench pattern CPp. Thereby, a portion of the sacrificial layer Sf is exposed.

Then, as illustrated in FIG. 7B, hot phosphoric acid ($H_3PO_4$) treatment is performed to remove the sacrificial layer Sf. Thereby, a memory hole MH having a U-shaped configuration is made in which the trench pattern CPp connects two of the through-holes TH.

As illustrated in FIG. 7C, a silicon nitride film forming the cap insulating film 44 is deposited with a thickness of 2 nm into the memory hole MH. Further, a silicon oxide film forming the outer insulating film 43 with a thickness of 10 nm, a silicon nitride film forming the memory layer 48 with a thickness of 4 nm, and a silicon oxide film forming the inner insulating film 42 of 5 nm are sequentially deposited on the cap insulating film 44 (including the side faces); and a stacked film 49 made of the cap insulating film 44, the outer insulating film 43, the memory layer 48, and the inner insulating film 42 is formed. Subsequently, a non-doped amorphous silicon film SPf forming the semiconductor pillar SP (the channel) is filled into the remaining space.

Subsequently, etch-back of the amorphous silicon film SPf is performed to expose the stacked film 49.

Thereby, as illustrated in FIG. 8A, the stacked film 49 of the cap insulating film 44, the outer insulating film 43, the memory layer 48, and the inner insulating film 42 are formed on the side face of the electrode film WL.

As illustrated in FIG. 8B, the stacked film 49 is formed also for the semiconductor connection portion CP portion.

Subsequently, dilute hydrofluoric acid treatment and hot phosphoric acid treatment are sequentially performed to remove the exposed stacked film 49.

Then, as illustrated in FIG. 7D, the inter-layer insulating film 16, an amorphous silicon film SGF forming the selection gate electrode SG, and the inter-layer insulating film 18 are sequentially deposited. Subsequently, a selection gate hole SGH is made in these films to reach the amorphous silicon film SPf in the memory hole MH.

Subsequently, a silicon nitride film forming a selection gate insulating film SGI of a selection gate transistor is deposited onto the inner side face of the selection gate hole SGH; the silicon nitride film on the bottom of the selection gate hole SGH is removed by etching; and then amorphous silicon, for example, forming the channel of the selection gate transistor is deposited and etched-back to the desired depth.

Thereafter, the nonvolatile semiconductor memory device 110 illustrated in FIG. 1 to FIG. 4 is formed after the prescribed contact formations and interconnection processes.

Characteristics of the nonvolatile semiconductor memory device 110 thus formed will now be described.

Figure 9A:
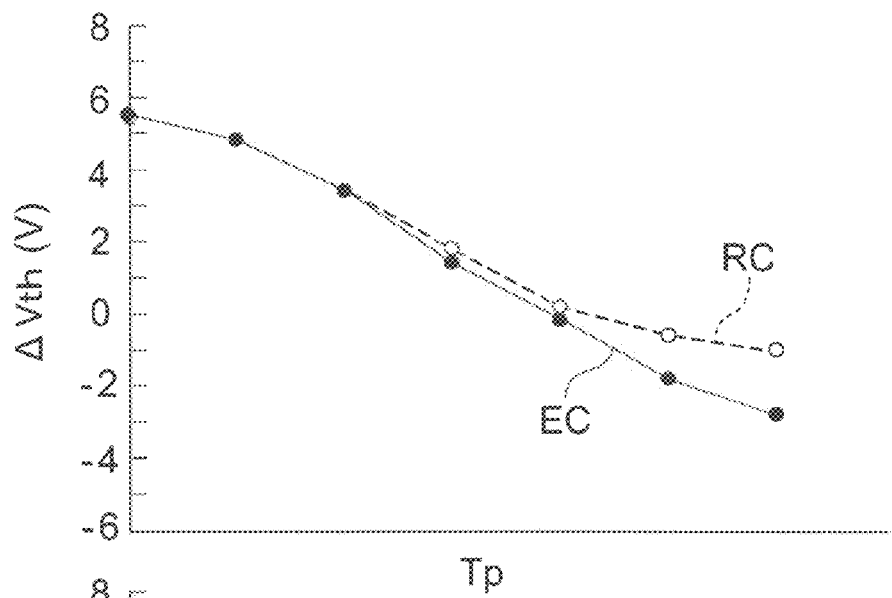
FIGS. 9A to 9C are schematic views illustrating the characteristics of the nonvolatile semiconductor memory devices of the embodiment of the invention and the comparative example.
Figure 9B:
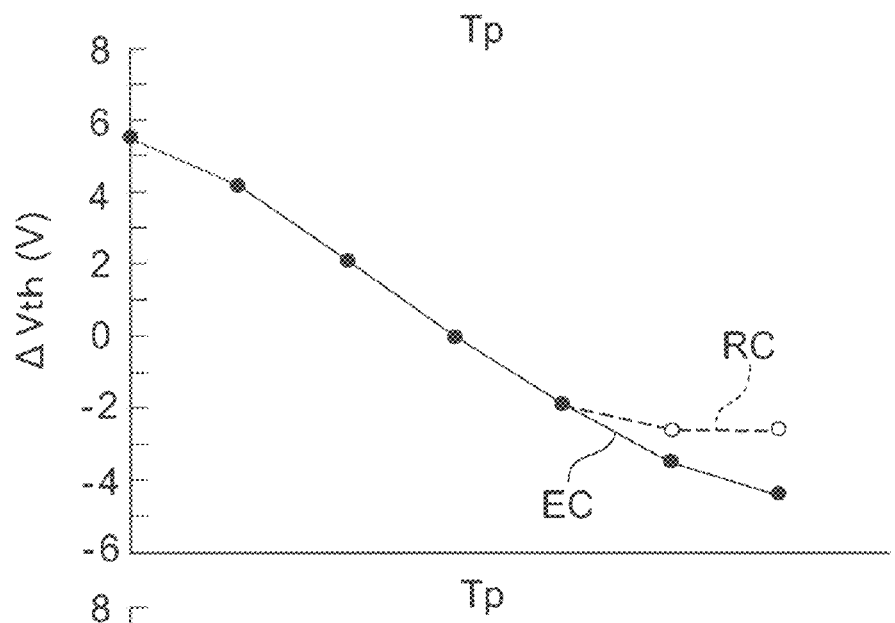
Figure 9C:
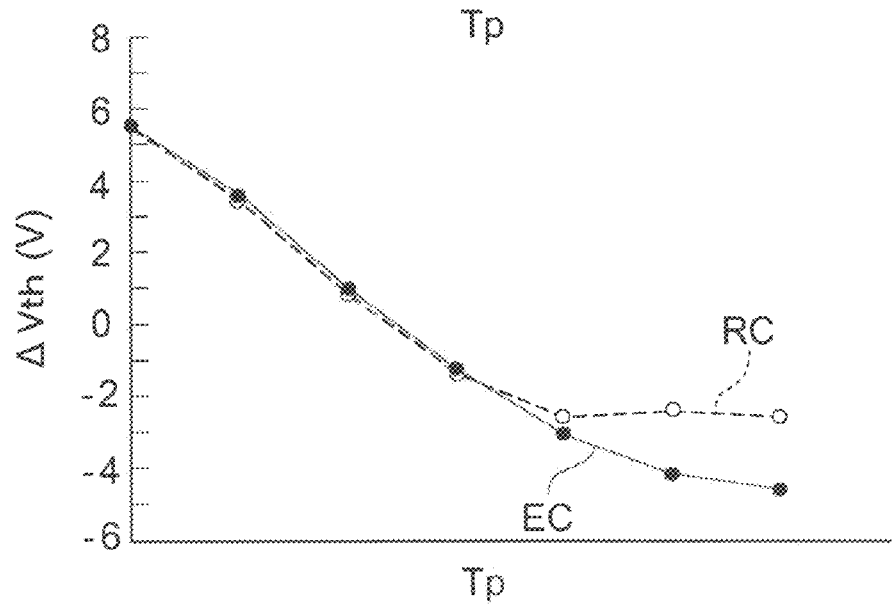

FIGS. 9A to 9C are schematic views illustrating characteristics of nonvolatile semiconductor memory devices of the embodiment of the invention and the comparative example.

Namely, FIGS. 9A, 9B, and 9C are graphs illustrating evaluation results of erasing characteristics of memory cells. An erasing pulse application duration Tp is plotted on the horizontal axis. A threshold voltage shift amount ΔVth of the memory cell MC is plotted on the vertical axis. FIGS. 9A, 9B, and 9C illustrate the results for erasing voltages of −18 V (volts), −20 V, and −22 V, respectively and illustrate the characteristic EC of the nonvolatile semiconductor memory device 110 according to the embodiment and the characteristic RC of the nonvolatile semiconductor memory device of the comparative example.

In the nonvolatile semiconductor memory device of the comparative example, the cap insulating film 44 is not provided; the stacked film 49 is made of the outer insulating film 43, the memory layer 48, and the inner insulating film 42; and the thickness of the outer insulating film 43 is 12 nm. Otherwise, the configuration is similar to that of the nonvolatile semiconductor memory device 110.

As illustrated in FIGS. 9A to 9C, the writing characteristic of the nonvolatile semiconductor memory device 110 is better than that of the comparative example for all of the erasing voltages.

In other words, for longer erasing pulse application durations Tp, the degree of the reduction of the threshold voltage shift amount ΔVth of the characteristic RC of the comparative example tends to be saturated; and the threshold voltage is not reduced sufficiently.

Conversely, for the characteristic EC of the nonvolatile semiconductor memory device 110 according to this embodiment, the threshold voltage shift amount ΔVth for longer erasing pulse application durations Tp decreases without saturation; and the threshold voltage is reduced sufficiently.

Thus, the erasing operation of the nonvolatile semiconductor memory device 110 is better than that of the comparative example. As described above, this improvement is an effect of the back-tunneling during the erasing operation being suppressed by providing the cap insulating film 44.

Because the erasing characteristics of the nonvolatile semiconductor memory device 110 are improved, the erasing operation can be performed at high speeds; and the stress applied to the memory cell MC during the application of the erasing voltage is mitigated. Therefore, the reliability of the memory cell MC can be increased.

In the nonvolatile semiconductor memory device 110 as illustrated in FIG. 8B, the cap insulating film 44 is provided also in the semiconductor connection portion CP portion. Therefore, electrons are not easily injected into the outer insulating film 43 at this portion as well, and back-tunneling does not occur easily.

Thus, the nonvolatile semiconductor memory device 110 may further include the back gate BG provided to oppose the semiconductor connection portion CP, the connection portion memory layer (the memory layer 48) provided between the back gate BG and the semiconductor connection portion CP, the connection portion inner insulating film (the inner insulating film 42) provided between the connection portion memory layer and the semiconductor connection portion CP, the connection portion outer insulating film (the outer insulating film 43) provided between the connection portion memory layer and the back gate BG, and the connection portion cap insulating film (the cap insulating film 44) provided between the connection portion outer insulating film and the back gate BG, where the connection portion cap insulating film has a relative dielectric constant higher than that of the connection portion outer insulating film.

As described in regard to FIG. 7C, the connection portion memory layer, the connection portion inner insulating film, the connection portion outer insulating film, and the connection portion cap insulating film recited above may be formed simultaneously with the memory layer 48, the inner insulating film 42, the outer insulating film 43, and the cap insulating film 44 provided to oppose the semiconductor pillar SP, respectively, and may be made of substantially the same materials, respectively.

In other words, the relative dielectric constant of the connection portion outer insulating film, the relative dielectric constant of the first outer insulating film, and the relative dielectric constant of the second outer insulating film are substantially the same; and the relative dielectric constant of the connection portion cap insulating film, the relative dielectric constant of the first cap insulating film, and the relative dielectric constant of the second cap insulating film are substantially the same.

Figure 10:
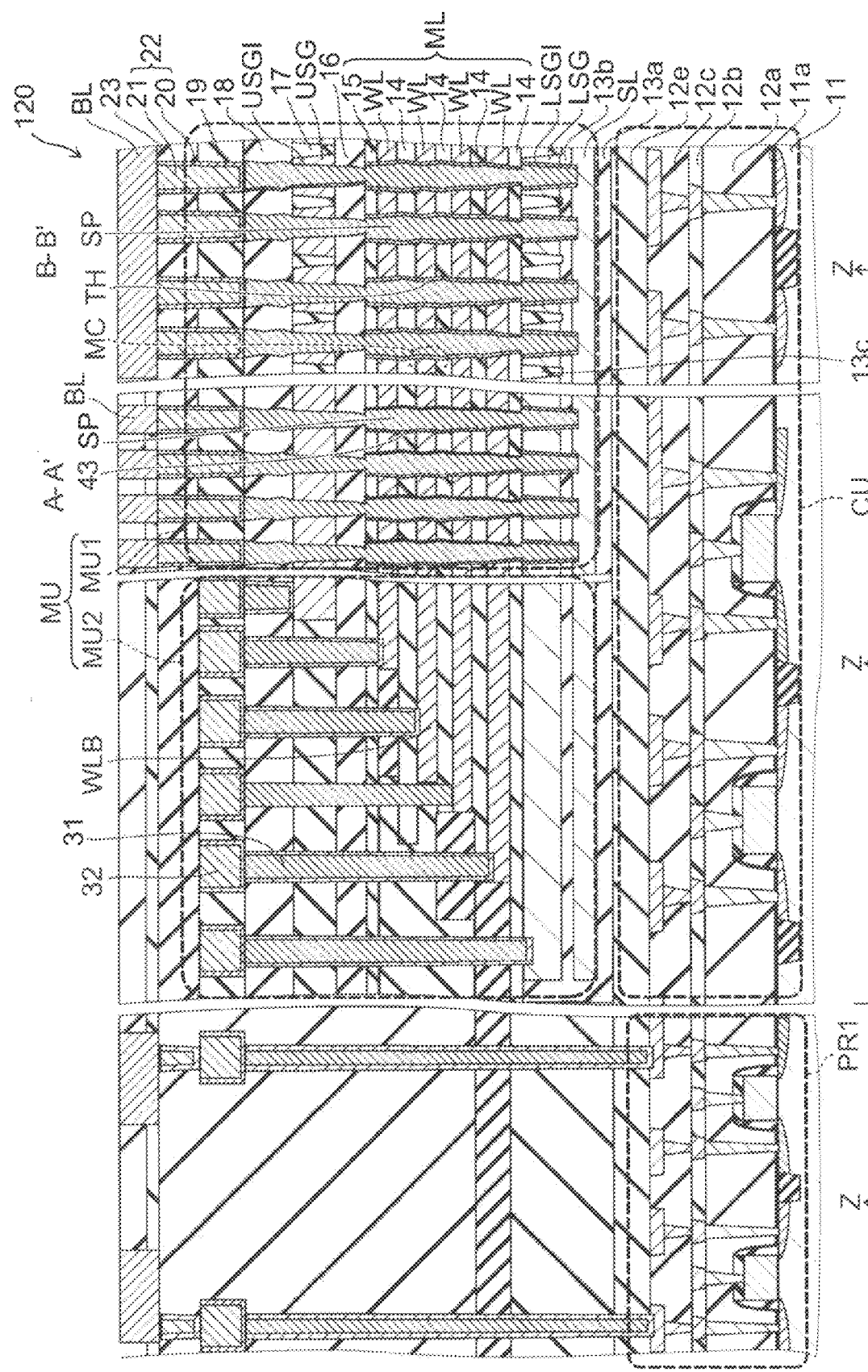
FIG. 10 is a schematic cross-sectional view illustrating the configuration of another nonvolatile semiconductor memory device according to the embodiment of the invention.

FIG. 10 is a schematic cross-sectional view illustrating the configuration of another nonvolatile semiconductor memory device according to the embodiment of the invention.

Figure 11:
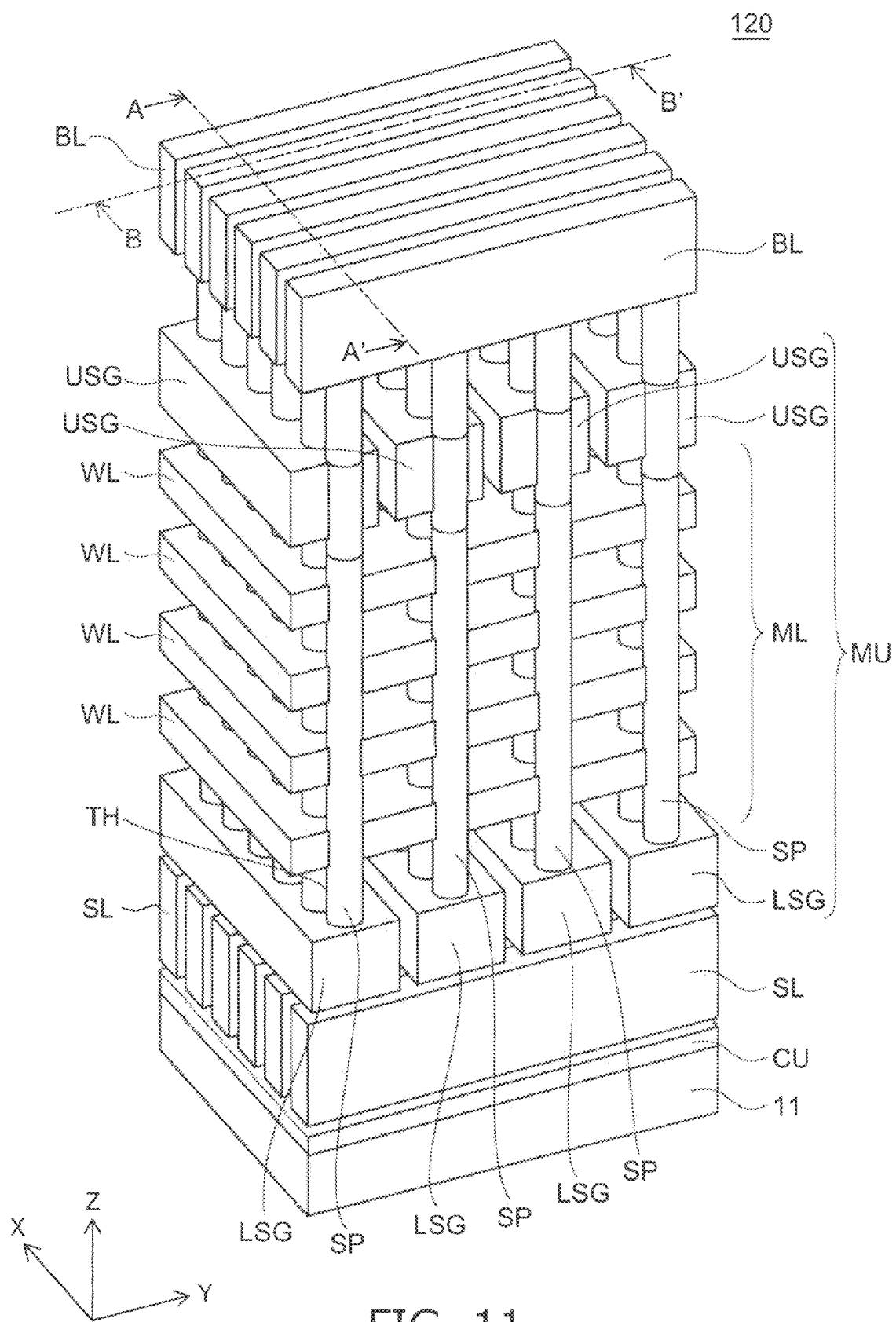
FIG. 11 is a schematic perspective view illustrating the configuration of the other nonvolatile semiconductor memory device according to the embodiment of the invention.

FIG. 11 is a schematic perspective view illustrating the configuration of the other nonvolatile semiconductor memory device according to the embodiment of the invention.

For easier viewing of the drawing in FIG. 11, only the conductive portions are illustrated, and the insulating portions are omitted.

In a nonvolatile semiconductor memory device 120 according to this embodiment as illustrated in FIG. 10 and FIG. 11, the semiconductor pillars SP are not connected in a U-shaped configuration; and each of the semiconductor pillars SP are independent. In other words, a NAND string having a straight-line configuration is provided in the nonvolatile semiconductor memory device 120. An upper selection gate electrode USG is provided on the stacked structural unit ML; and a lower selection gate electrode LSG is provided below the stacked structural unit ML.

An upper selection gate insulating film USGI made of, for example, silicon oxide is provided between the upper selection gate electrode USG and the semiconductor pillar SP; and a lower selection gate insulating film LSGI made of, for example, silicon oxide is provided between the lower selection gate electrode LSG and the semiconductor pillar SP.

The source line SL is provided below the lower selection gate electrode LSG. An inter-layer insulating film 13a is provided below the source line SL. An inter-layer insulating film 13b is provided between the source line SL and the lower selection gate electrode LSG.

The semiconductor pillar SP is connected to the source line SL below the lower selection gate electrode LSG. The semiconductor pillar SP is connected to the bit line BL above the upper selection gate electrode USG. The memory cells MC are formed in the stacked structural unit ML between the upper selection gate electrode USG and the lower selection gate electrode LSG. The semiconductor pillar SP functions as one NAND string having a straight-line configuration.

The upper selection gate electrode USG and the lower selection gate electrode LSG are divided by the inter-layer insulating film 17 and an inter-layer insulating film 13c, respectively, and have band configurations aligned along the X axis direction.

On the other hand, the bit line BL connected to the upper portion of the semiconductor pillar SP and the source line SL connected to the lower portion of the semiconductor pillar SP have band configurations aligned in the Y axis direction.

In such a case, the electrode film WL is a conductive film having a plate configuration parallel to the X-Y plane.

The cap insulating film 44 described in regard to FIG. 1 may be used also in the nonvolatile semiconductor memory device 120 having such a structure. In such a case as well, back-tunneling during the erasing operation is suppressed; the erasing characteristics are thereby improved; and the high reliability is achieved.

In the case where a NAND string structure having a straight-line configuration is used in which the semiconductor pillars SP are not connected in U-shaped configurations such as in the nonvolatile semiconductor memory device 120, etching of the bottom face of the through-hole TH is performed to make contact with the semiconductor substrate 11 (including the source line SL) and the lower selection gate after the stacked film 49 is formed on the wall face of the through-hole TH; and etching with dilute hydrofluoric acid may be performed also to remove the native oxide film to obtain a good contact when filling the amorphous silicon film SPf into the through-hole TH to form the semiconductor pillar SP. In such a case, such wet etching removes the silicon oxide films and the like formed on the side walls of the through-hole TH. Therefore, a special contrivance is necessary to use a silicon oxide film as the selection gate insulating film SGI of the selection gate transistor and the tunneling insulating film (the inner insulating film 42) of the stacked film 49 of the memory cell MC.

Conversely, in the case of the nonvolatile semiconductor memory device 110 having the NAND string structure of the U-shaped configuration, there is no lower selection gate transistor; and contact with the semiconductor substrate 11 at the lower portion is unnecessary. Therefore, it is substantially unnecessary to perform the wet etching recited above. Therefore, after depositing the stacked film 49 onto the wall face of the through-hole TH, the amorphous silicon film SPf forming the semiconductor pillar SP can be filled continuously. Thereby, it is possible to use a silicon oxide film as the tunneling insulating film (the inner insulating film 42). Thus, in the nonvolatile semiconductor memory device 110, the constraints on the materials used as the insulating film are relaxed; and a wider selection range of usable materials is possible.

Also, in this embodiment as described above, by utilizing the difference of the electric fields due to the curvature radii between the inner and outer sides of the pipe when employing the collectively patterned three-dimensionally stacked structure, the constraints on the relative dielectric constant required for the outer insulating film 43 can be relaxed; the compatibility of the process integration is high for both the inner insulating film 42 and the outer insulating film 43; and a highly reliable silicon oxide film can be used.

By further providing the cap insulating film 44 of a high relative dielectric constant silicon nitride film and the like, back-tunneling during the erasing operation is suppressed. Thereby, the erasing characteristics are improved; and a nonvolatile semiconductor memory device can be provided with a three-dimensionally stacked structure having high reliability.

Although the case is described above where a silicon nitride film (silicon nitride) is used as the memory layer 48, the invention is not limited thereto. The memory layer 48 may include a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

It is sufficient for the relative dielectric constant of the cap insulating film 44 to be higher than that of the outer insulating film 43. The inter-electrode insulating film 14, the inner insulating film 42, the outer insulating film 43, and the cap insulating film 44 may include a single-layer film or a stacked film, the single-layer film being one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as semiconductor substrates, electrode films, insulating films, insulating layers, stacked structural units, charge storage layers, semiconductor pillars, word lines, bit lines, source lines, memory strings, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices practicable by an appropriate design modification by one skilled in the art based on the nonvolatile semiconductor memory devices described above as exemplary embodiments of the invention also are within the scope of the invention to the extent that the purport of the invention is included.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device, comprising:
   a stacked structural unit including a plurality of electrode films stacked alternately in a first direction with a plurality of inter-electrode insulating films;
   a first semiconductor pillar piercing the stacked structural unit in the first direction;
   a first memory layer provided between the electrode films and the first semiconductor pillar;
   a first inner insulating film provided between the first memory layer and the first semiconductor pillar;
   a first outer insulating film provided between the first memory layer and the electrode films; and
   a first cap insulating film provided between the first outer insulating film and the electrode films, the first cap insulating film having a relative dielectric constant higher than a relative dielectric constant of the first outer insulating film.

2. The device according to claim 1, wherein a thickness of the first cap insulating film is thinner than a thickness of the first outer insulating film.

3. The device according to claim 1, wherein a thickness of the first cap insulating film is thinner than a thickness of the first inner insulating film.

4. The device according to claim 1, wherein a thickness of the first cap insulating film is thinner than a thickness of the first memory layer.

5. The device according to claim 1, wherein a thickness of the first inner insulating film is thinner than a thickness of the first outer insulating film.

6. The device according to claim 1, wherein a thickness of the first memory layer is thinner than a thickness of the first inner insulating film and a thickness of the first outer insulating film.

7. The device according to claim 1, wherein a thickness of the first outer insulating film is not less than 5 nanometers and not more than 20 nanometers, and a thickness of the first cap insulating film is not less than 1 nanometer and not more than 4 nanometers.

8. The device according to claim 1, wherein the first outer insulating film includes silicon oxide and the first cap insulating film includes silicon nitride.

9. The device according to claim 8, wherein the first inner insulating film includes a silicon oxide film.

10. The device according to claim 9, wherein the inter-electrode insulating films include a silicon oxide film.

11. The device according to claim 10, wherein the first memory layer includes a silicon nitride film.

12. The device according to claim 1, wherein the first outer insulating film includes a silicon oxide film and the first cap insulating film includes aluminum oxide.

13. The device according to claim 1, wherein the first memory layer includes a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

14. The device according to claim 1, wherein at least one selected from the inter-electrode insulating films, the first inner insulating film, and the first outer insulating film includes a single-layer film or a stacked film, the single-layer film being one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

15. The device according to claim 1, further comprising an intermediate layer provided between the first outer insulating film and the first cap insulating film, the intermediate layer having a relative dielectric constant higher than a relative dielectric constant of the first outer insulating film and lower than a relative dielectric constant of the first cap insulating film.

16. The device according to claim 15, a relative dielectric constant of the intermediate layer changes continuously along a direction from the first outer insulating film to the first cap insulating film.

17. The device according to claim 15, wherein a relative dielectric constant of the first outer insulating film, a relative dielectric constant of the intermediate layer, and a relative dielectric constant of the first cap insulating film change continuously.

18. The device according to claim 1, further comprising:
   a second semiconductor pillar piercing the stacked structural unit in the first direction, the second semiconductor pillar being adjacent to the first semiconductor pillar in a second direction perpendicular to the first direction;
   a second memory layer provided between the electrode films and the second semiconductor pillar;
   a second inner insulating film provided between the second memory layer and the second semiconductor pillar;
   a second outer insulating film provided between the second memory layer and the electrode films;
   a second cap insulating film provided between the second outer insulating film and the electrode films, the second cap insulating film having a relative dielectric constant higher than a relative dielectric constant of the second outer insulating film;
   a semiconductor connection portion electrically connecting an end of the first semiconductor pillar on a first side of the first direction and an end of the second semiconductor pillar on the first side;
a first interconnection aligned in the second direction to connect to a first end portion of the first semiconductor pillar on a side opposite to the semiconductor connection portion; and
a second interconnection aligned in a third direction orthogonal to the first direction and the second direction to connect to a second end portion of the second semiconductor pillar on a side opposite to the semiconductor connection portion.

19. The device according to claim 18, further comprising:
a connection portion conductive layer provided to oppose the semiconductor connection portion;
a connection portion memory layer provided between the connection portion conductive layer and the semiconductor connection portion;
a connection portion inner insulating film provided between the connection portion memory layer and the semiconductor connection portion;
a connection portion outer insulating film provided between the connection portion memory layer and the connection portion conductive layer; and
a connection portion cap insulating film provided between the connection portion outer insulating film and the connection portion conductive layer, the connection portion cap insulating film having a relative dielectric constant higher than a relative dielectric constant of the connection portion outer insulating film.

20. The device according to claim 19, wherein a relative dielectric constant of the connection portion outer insulating film is substantially equal to a relative dielectric constant of the first outer insulating film and a relative dielectric constant of the second outer insulating film, and a relative dielectric constant of the connection portion cap insulating film is substantially equal to a relative dielectric constant of the first cap insulating film and a relative dielectric constant of the second cap insulating film.

* * * * *